United States Patent
Miao et al.

(10) Patent No.: US 11,049,979 B2
(45) Date of Patent: Jun. 29, 2021

(54) LONG CHANNEL NANOSHEET FET HAVING TRI-LAYER SPACERS

(71) Applicant: International Business Machines Corporation, Armonk, NY (US)

(72) Inventors: Xin Miao, Slingerlands, NY (US); Ruilong Xie, Niskayuna, NY (US); Jingyun Zhang, Albany, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/686,302

(22) Filed: Nov. 18, 2019

(65) Prior Publication Data
US 2021/0151607 A1    May 20, 2021

(51) Int. Cl.
| H01L 29/786 | (2006.01) |
| H01L 27/12 | (2006.01) |
| H01L 21/8234 | (2006.01) |
| H01L 29/51 | (2006.01) |
| H01L 29/423 | (2006.01) |
| H01L 29/66 | (2006.01) |
| H01L 29/06 | (2006.01) |

(52) U.S. Cl.
CPC ........ *H01L 29/78696* (2013.01); *H01L 21/823412* (2013.01); *H01L 21/823468* (2013.01); *H01L 27/1251* (2013.01); *H01L 29/0673* (2013.01); *H01L 29/42392* (2013.01); *H01L 29/513* (2013.01); *H01L 29/6656* (2013.01); *H01L 29/66553* (2013.01)

(58) Field of Classification Search
CPC ......... H01L 29/78696; H01L 29/42392; H01L 29/513; H01L 27/1251; H01L 21/823468; H01L 29/0673; H01L 29/66553; H01L 29/6656
See application file for complete search history.

(56) References Cited

U.S. PATENT DOCUMENTS

| 9,484,423 B2 | 11/2016 | Obradovic |
| 9,490,323 B2 | 11/2016 | Rodder |
| 9,620,590 B1 | 4/2017 | Bergendahl |
| 9,653,287 B2 | 5/2017 | Rodder |
| 9,704,863 B1 | 7/2017 | Cheng |
| 9,947,743 B2 | 4/2018 | Doris |
| 9,947,804 B1 * | 4/2018 | Frougier ........... H01L 29/78696 |
| 10,332,963 B1 | 6/2019 | Xie |
| 10,355,103 B2 | 7/2019 | Chao |
| 2017/0365661 A1 * | 12/2017 | Doris ............... H01L 29/66545 |
| 2019/0198629 A1 | 6/2019 | Yeung |

OTHER PUBLICATIONS

Loubet et al., "Stacked nanosheet gate-all-around transistor to enable scaling beyond FinFET", IEEE 2017 Symposium on VLSI Technology, pp. T230-T231, 978-4-86348-605-8 ©2017 JSAP.

* cited by examiner

*Primary Examiner* — Feifei Yeung Lopez
(74) *Attorney, Agent, or Firm* — David K. Mattheis; William H. Hartwell; Nicholas L. Cadmus

(57) ABSTRACT

A semiconductor device and method of forming the same including a plurality of vertically aligned long channel semiconductor channel layers disposed above a substrate layer, a plurality of vertically aligned short channel semiconductor channel layers disposed above a substrate layer, and a plurality of tri-layer dielectric spacers disposed between the vertically aligned long channel semiconductor layers.

10 Claims, 11 Drawing Sheets

LONG CHANNEL NANOSHEET FET HAVING TRI-LAYER SPACERS

BACKGROUND

The disclosure relates generally to gate-all-around (GAA) transistor structures. The disclosure relates particularly to long channel GAA transistor structures having tri-layer inter-channel spacers.

Gate-all-around (GAA) vertical stacked field effect transistors (VFET) may include a stack of semiconductor nanosheets encased in a work function metal (WFM), as part of the gates of the structures. These structures may be used as part of device downscaling efforts. Long channel GAA structures may include channel structures having lengths in the range of AA to BB nanometers.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device and method of forming the same including a plurality of vertically aligned long channel semiconductor channel layers disposed above a substrate layer, a plurality of vertically aligned short channel semiconductor channel layers disposed above a substrate layer, and a plurality of tri-layer dielectric spacers disposed between the vertically aligned long channel semiconductor layers.

In one aspect, a method of forming a semiconductor device includes forming a stack of alternating long channel layers and sacrificial layers on a substrate layer, forming source and drain structures at ends of the long channel layers, etching away portions of the sacrificial layers exposing channel layer surfaces, leaving pillars of sacrificial material between long channel layers, and forming gate stacks on and around the channel layers.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
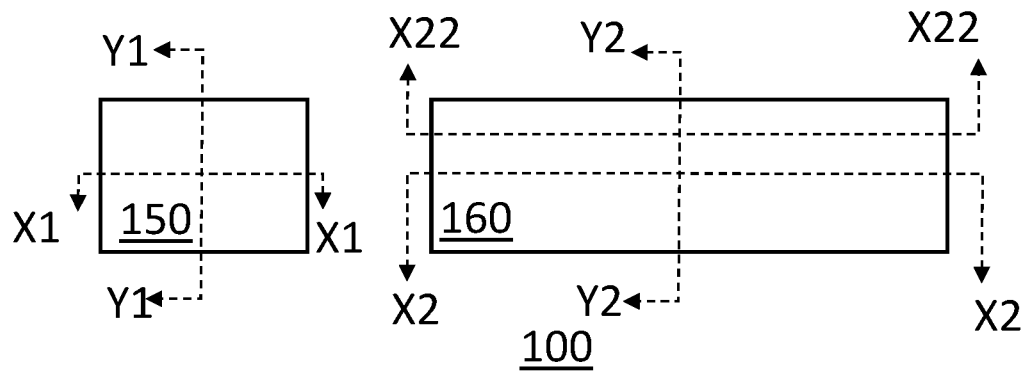
FIG. 1 provides a top view of a step in the fabrication of a semiconductor device, according to an embodiment of the invention. The figure illustrates the top view of a formed stack of alternating sacrificial and channel layers of short channel and long channel semiconductor field effect transistor devices disposed on a substrate. The figure includes section lines X1, Y1, X2, and X22, referred to in additional figures.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials, and process features, and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below", or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The following description includes long channel gate-all-around (GAA) semiconductor devices having a plurality of long semiconductor channel layers aligned in a vertical stack. The channel layers are evenly separated. The stack also includes tri-layer spacers disposed between long channel layers.

Disposing the tri-layer spacers between the long channels reduces the occurrence of bending or sagging of the long channels during fabrication due to capillary and surface tension forces acting upon the long channels.

Reference is now made to the figures, in which identical reference numbers refer to the same or similar elements. FIG. 1 provides a top view 100 of short 150 and long 160 channel devices at an early stage of the fabrication process. Section lines Y1, X1, Y2, X2, and X22 relate to FIGS. 2 through 19.

Figure 2:
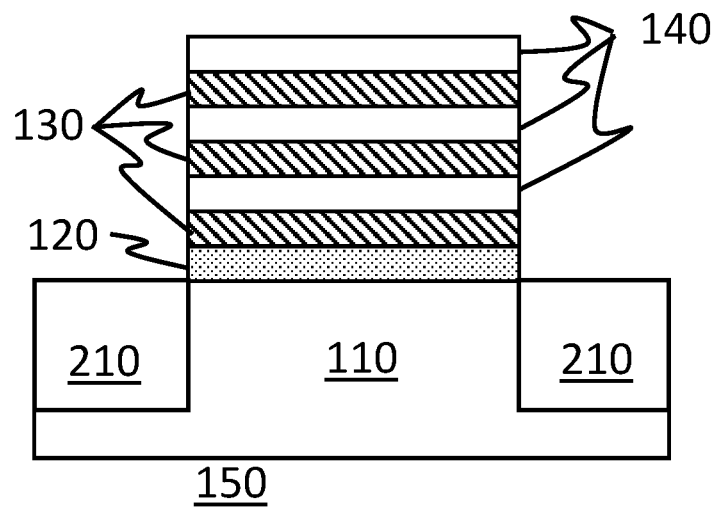
FIG. 2 provides a cross-sectional view along section line Y1 of FIG. 1, of a step in the fabrication of semiconductor devices, according to an embodiment of the invention. The figure illustrates etched stacks of alternating layers of sacrificial and channel layers and the addition of a shallow trench isolation layer to the short channel device.
Figure 3:
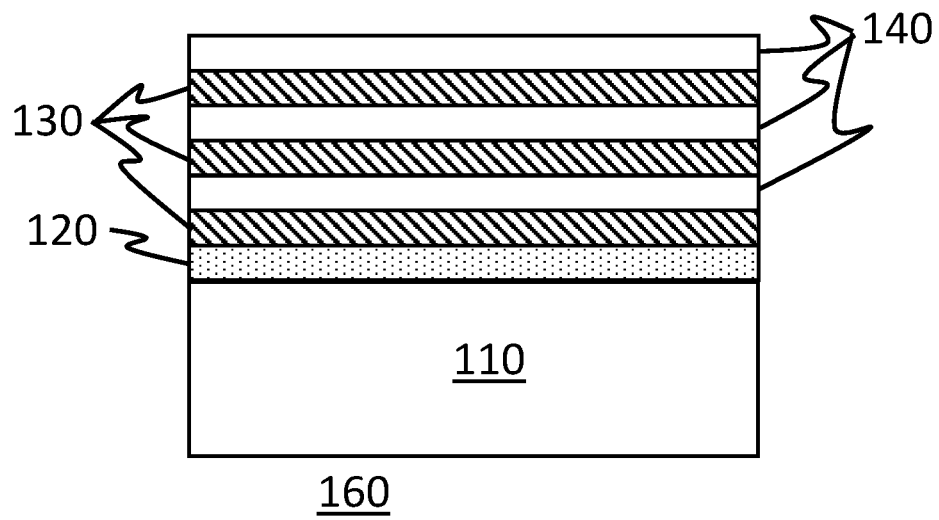
FIG. 3 provides a cross-sectional view along section line X2 of FIG. 1, of a step in the fabrication of semiconductor devices, according to an embodiment of the invention. The figure illustrates etched stacks of alternating layers of sacrificial and channel layers and the addition of a shallow trench isolation layer to the long channel device.

FIG. 2 illustrates a cross-sectional view common to the short and long channel devices at an early stage in the method of forming the devices along section line Y1 of FIG. 1. FIG. 3 provides a cross-sectional view of the long channel device along section line X1 of FIG. 1. The semiconductor structure of FIGS. 2 and 3, includes a semiconductor material stack of vertically aligned layers including a bottom sacrificial semiconductor layer 120, alternating layers of a sacrificial semiconductor material layer 130 and a semiconductor channel material layer 140, wherein the semiconductor material stack is located on a topmost surface of a semiconductor substrate 110.

The semiconductor substrate 110 may include any semiconductor material including, for example, silicon. The term "semiconductor material" is used throughout the present application to denote a material that has semiconducting properties. Besides silicon, the semiconductor material may be strained Si, SiC (silicon carbide), Ge (germanium), SiGe (silicon germanium), SiGeC (silicon-germanium-carbon), Si alloys, Ge alloys, III-V semiconductor materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

The semiconductor material stack is then sequentially formed upon the semiconductor substrate 110. As mentioned above, the semiconductor material stack includes a bottom most sacrificial semiconductor material layer 120 and alternating sacrificial semiconductor layers 130 and semiconductor channel material layer 140 one atop the other. In FIGS. 2 and 3 and by way of one example, the semiconductor material stack includes one sacrificial semiconductor layer 120, three sacrificial semiconductor material layers 130, and three semiconductor channel material layers 140. The semiconductor material stack that can be employed in the present application is not limited to the specific embodiment illustrated in FIGS. 1 through 3. Instead, the semiconductor material stack can include any number of sacrificial semiconductor material layers 130 and corresponding semiconductor channel material layers 140, atop sacrificial semiconductor material layer 120, so long as the semiconductor material stacks includes at least two sacrificial semiconductor material layers 130, and two semiconductor channel material layers 140.

Each sacrificial semiconductor material layer 120 and 130, is composed of a first semiconductor material which differs in composition from at least an upper portion of the semiconductor substrate 110 and is resistant to Ge condensation. In one embodiment, the upper portion of the semiconductor substrate 110 is composed of silicon, while each sacrificial semiconductor material layers 120 and 130 is composed of a silicon germanium alloy. In such an embodiment, the SiGe alloy that provides each sacrificial semiconductor material layer 120 has a germanium content that is greater than 50 atomic percent germanium. In one example, the SiGe alloy that provides each sacrificial semiconductor material layer 120 has a germanium content from 50 atomic percent germanium to 70 atomic percent germanium. In such an embodiment, the SiGe alloy that provides each sacrificial semiconductor material layer 130 has a germanium content that is less than 50 atomic percent germanium. In one example, the SiGe alloy that provides each sacrificial semiconductor material layer 130 has a germanium content from 20 atomic percent germanium to 40 atomic percent germanium. The first semiconductor material that provides each sacrificial semiconductor material layers 120 and 130 can be formed utilizing an epitaxial growth (or deposition process) as defined in greater detail herein below.

Each semiconductor channel material layer 140, is composed of a second semiconductor material that has a different etch rate than the first semiconductor material of the sacrificial semiconductor material layers 120 and 130 and is also resistant to Ge condensation. The second semiconductor material of each semiconductor channel material layer 140, may be the same as, or different from, the semiconductor material of at least the upper portion of the semiconductor substrate 110. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 110 and each semiconductor channel material layer 130 is composed of Si or a III-V compound semiconductor, while each sacrificial semiconductor material layer 120, 130 is composed of a silicon germanium alloy. The second semiconductor material of each semiconductor channel material layer 140, can be formed utilizing an epitaxial growth (or deposition process) as defined in greater detail herein below.

The layers of channel material and sacrificial material 140, 130 and 120, are formed on the substrate 110 by any appropriate deposition process. For example, the alternating layers may be formed by alternating deposition processes including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Sacrificial semiconductor material layer 120, may have a thickness from about 5 nanometers (nm) to about 15 nm, each nanosheet sacrificial semiconductor material layer 120, may have a thickness from about 8 nm to about 12 nm, while each nanosheet semiconductor channel material layer 140, may have a thickness from about 5 nm to about 15 nm. In an embodiment, each sacrificial semiconductor material layer 130 has an identical thickness, each semiconductor layer 140 has an identical thickness. The term "nanosheet" denotes a substantially two-dimensional structure with thickness in a scale ranging from 1 to 100 nm. The width and length dimensions of the nanosheet may be greater than the thickness dimensions.

FIG. 2 also illustrates shallow trench isolation (STI) regions 210 adjacent to the stacks of sacrificial semiconductor material layers 120, 130, and semiconductor channel material layers 140 of the long and short channel devices. The STI regions 210 can be formed by, any suitable process including, for example, lithography or etching to form trenches, and then filling the trenches with an insulating material, such as silicon dioxide. Following the deposition of the STI material, an additional etching process can be performed to remove portions of the STI material and expose the stacks of layers 120, 130, and 140. The stacks of sacrificial semiconductor material layers 120, 130, and semiconductor channel material layers 140, are formed by, for example, a photolithographic patterning and etching process that removes exposed portions of the sacrificial semiconductor material layers 120, 130, and semiconductor channel material layers 140, to form the stacks of layers. This etching can be performed using a timed anisotropic etch such as reactive ion etching (RIE). The etch can be performed in a single etch that removes material from both the channel layers 140, and the sacrificial layers 120, 130 or may, alternatively, be performed using alternating etching processes that selectively affect the channel layers 140, and the sacrificial layers 120, 130, in turn. As used herein, the term "selective" in reference to a material removal process denotes that the rate of material removal for a first material is greater than the rate of removal for at least another material of the structure to which the material removal process is being applied.

Figure 4:
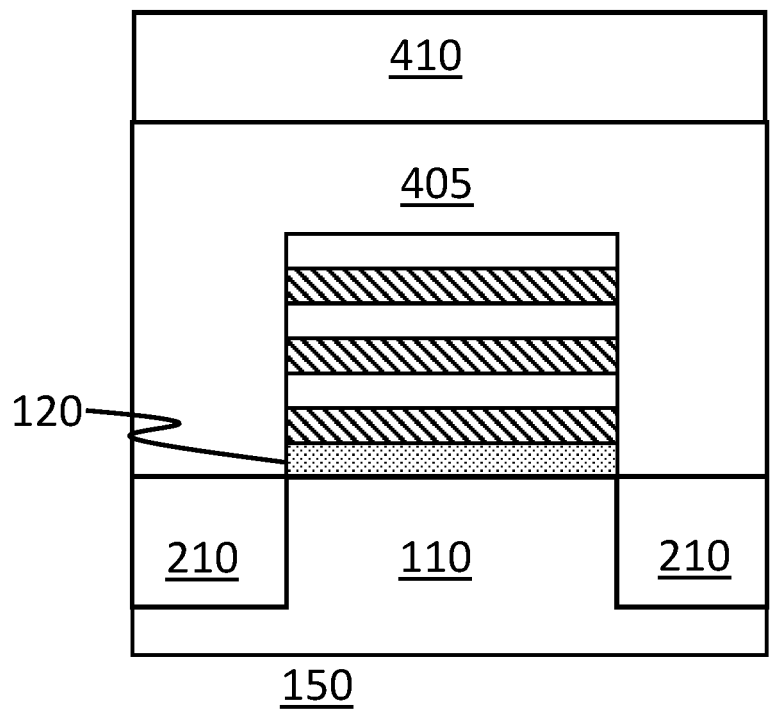
FIG. 4 provides a cross-sectional view along section line Y1 of FIG. 1, of a step in the fabrication of semiconductor devices, according to an embodiment of the invention. The figure illustrates the addition of a dummy gate and hard mask to the short channel devices.
Figure 5:
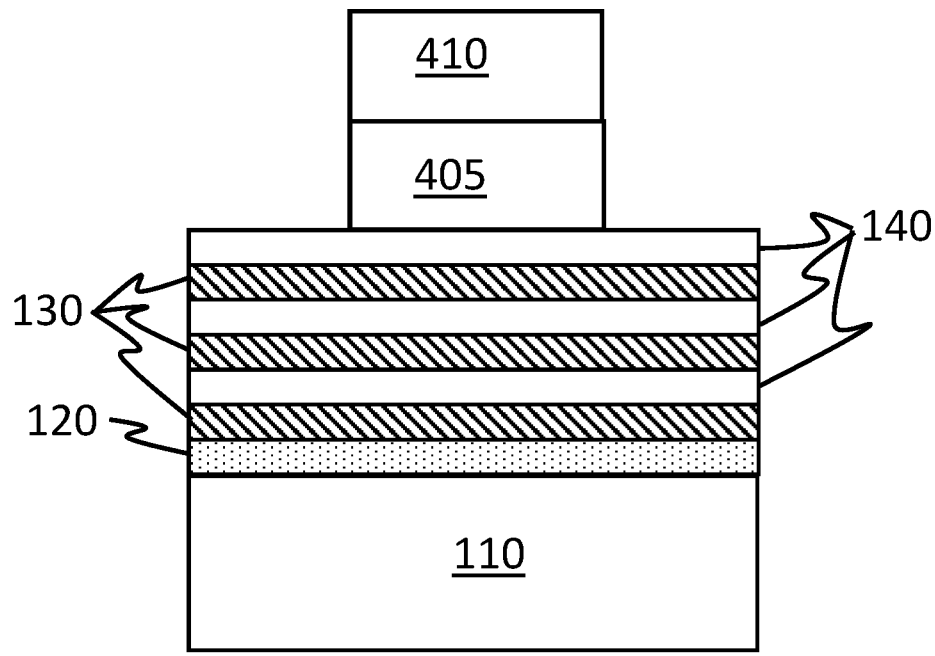
FIG. 5 provides a cross-sectional view along section line X2 of FIG. 1 of a step in the fabrication of semiconductor devices, according to an embodiment of the invention. The figure illustrates the addition of a dummy gate and hard mask to the long channel device.
Figure 6:
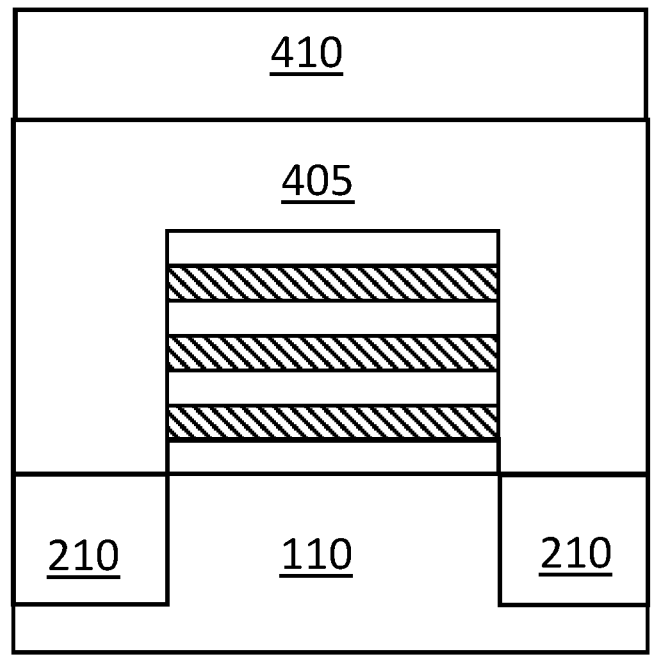
FIG. 6 provides a cross-sectional view along section line Y1 of FIG. 1, of a step in the fabrication of semiconductor devices, according to an embodiment of the invention. The figure illustrates the removal of a sacrificial layer from the short channel device.

Reference is now made to FIGS. 4 and 5, illustrating a step in the formation of the semiconductor devices of an embodiment of the invention. FIG. 4 provides a cross-sectional view along line Y1 of FIG. 1, and common to both the long 160 and short 150 channel devices at this stage. FIG. 5 provides a cross-sectional view along line X2 of FIG. 1, illustrating the long channel device 160 at this stage. FIGS. 5 and 6 illustrate stacks of vertically aligned nanosheet sacrificial semiconductor material layers 120, 130, and semiconductor channel material layers 140. As shown in the figures, portions of the stacks are covered and protected by a dummy gate structure 405 and hard mask layer 410. Dummy gate 405 In one embodiment, dummy gate 405 is composed of silicon nitride, deposited using, for example, low pressure chemical vapor deposition (LPCVD). Other materials of which dummy gate 405 may be formed include, but are not limited to, silicon oxide, silicon oxide doped with carbon, titanium oxide, hafnium oxide, any other insulative material. In a preferred embodiment, dummy gate 405 is between 20 nm and 200 nm thick and is preferably about 70 nm thick. A person of ordinary skill in the art will recognize that chemical-mechanical-planarization (CMP) steps may be inserted before and after the deposition of dummy gate 405 and hard mask 410 to ensure that the top surface of dummy gate 405 and hard mask 410 are relatively flat. The process of patterning dummy gate 405 to define the desired shape of the nanosheet stacks to be created involves the use of standard photolithographic processes to define the desired shape in a layer of photoresist (not shown) deposited on the material of which dummy gate 405 is formed. In various embodiments, standard photolithographic processes are used to remove a portion of the photoresist layer corresponding to the area of the material of which dummy gate 405 is formed which is to be etched during the formation of dummy gate 405. The pattern of dummy gate 405 defined in the photoresist layer is formed into dummy gate 405 by removing dummy gate 405 from the areas not protected by the pattern in the photoresist layer. The portion of the material of which dummy gate 405 is formed is removed using, for example, RIE. A person of ordinary skill in the art will recognize that the type of plasma used in the RIE process will depend on the material of which dummy gate 405 is composed, or that other etch processes, e.g., wet chemical etch, laser ablation, etc., may be used.

The hard mask 410 may be formed of a nitride, oxide, an oxide-nitride bilayer, or another suitable material. In some embodiments, the hard mask 410 may comprise an oxide such as silicon oxide (SiO), a nitride such as silicon nitride (SiN), an oxynitride such as silicon oxynitride (SiON), combinations thereof, etc. In some embodiments, the hard mask 410 is a silicon nitride such as $Si_3N_4$. The width or horizontal thickness (in direction X-X') of the hard mask 410 matches that of the underlying dummy gate 405. The hard mask 410 may have a height or vertical thickness in a Z or surface normal direction ranging from 10 nanometers (nm) to 50 nm.

Figure 7:
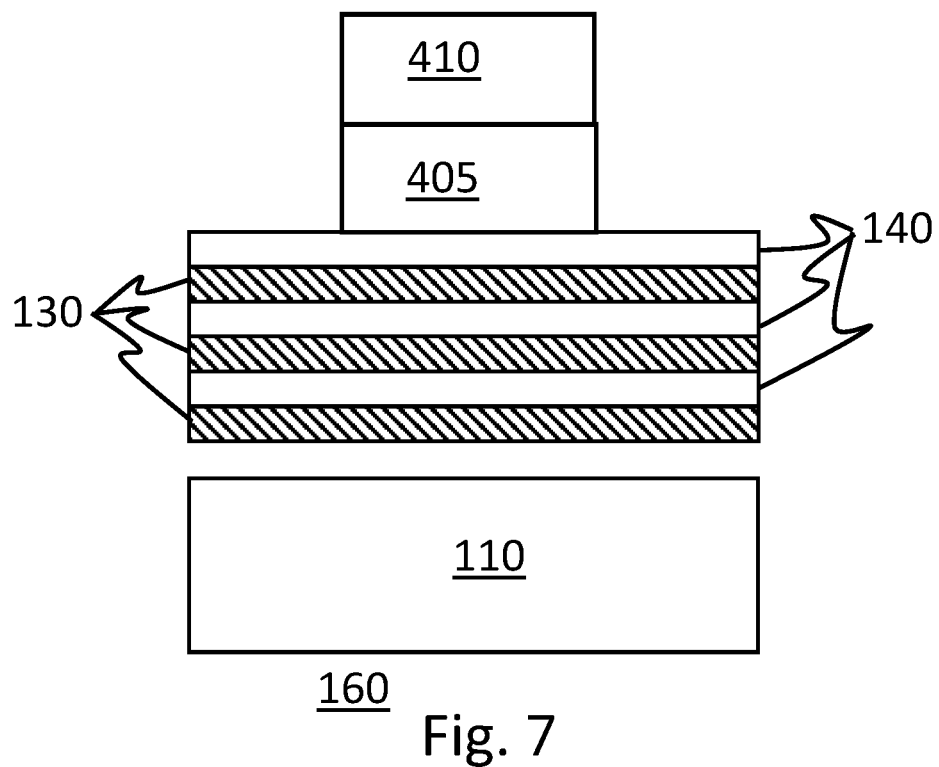
FIG. 7 provides a cross-sectional view along section line X2 of FIG. 1, of a step in the fabrication of semiconductor devices, according to an embodiment of the invention. The figure illustrates the removal of a sacrificial layer from the long channel device.

Subsequent to the formation of dummy gate 405 and hard mask 410, sacrificial semiconductor layer 120 is removed as illustrated in FIGS. 6, and 7 along FIG. 1 section lines Y1 and X2 respectively. In an embodiment, sacrificial semiconductor material layers 120 are etched away using an isotropic etch, such as a wet or dry chemical etch selective to the sacrificial semiconductor material. The removal of sacrificial semiconductor material layers 120 leave gaps between the substrate 110 and the lowest sacrificial semiconductor material layer 130 for each of the long and short channel devices.

Figure 8:
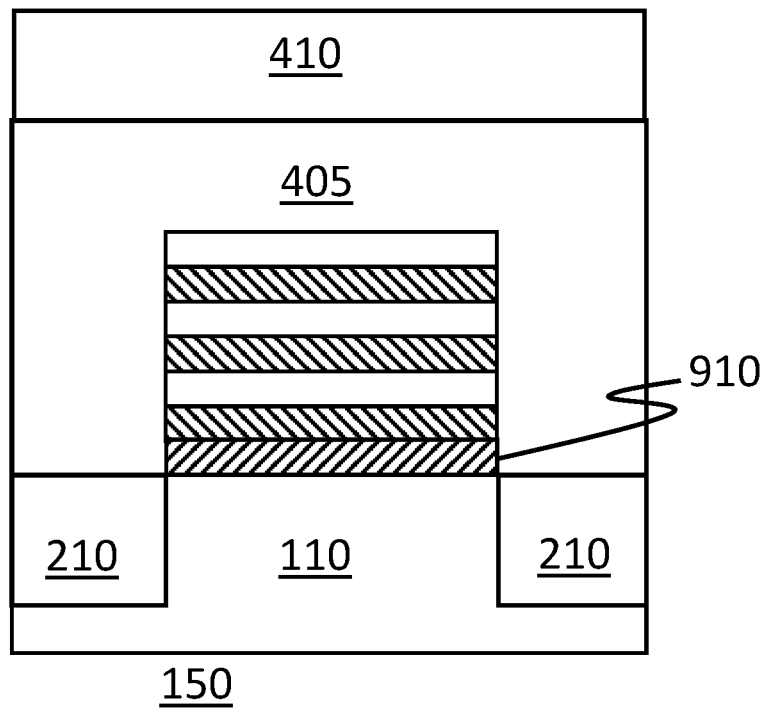
FIG. 8 provides a cross-sectional view along section line Y1 of FIG. 1, of a step in the fabrication of semiconductor devices, according to an embodiment of the invention. The figure illustrates the addition of a bottom dielectric isolation layer to the short channel device.
Figure 9:
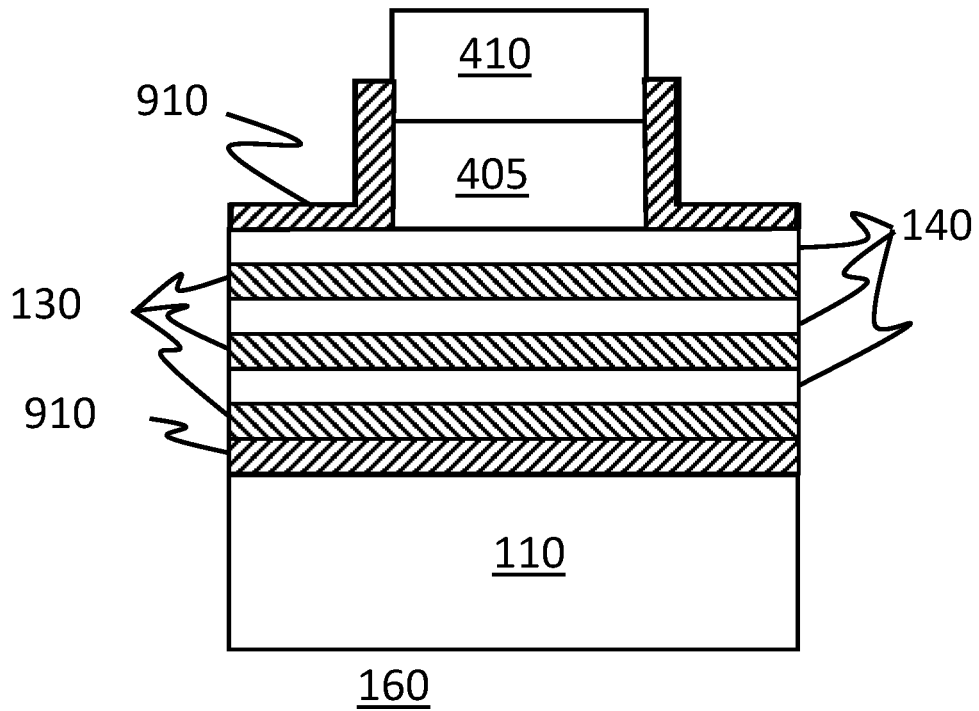
FIG. 9 provides a cross-sectional view along section line X2 of FIG. 1, of a step in the fabrication of semiconductor devices, according to an embodiment of the invention. The figure illustrates the addition of a bottom dielectric isolation layer and dielectric gate spacers to the long channel device.

Reference is now made to FIGS. 8 and 9, illustrating a step in the formation of the semiconductor devices of an embodiment of the invention. As shown in the figures, a dielectric isolation layer 910 has been disposed upon the short and long channel devices. In an embodiment, dielectric isolation layer 910 comprises silicon dioxide or another dielectric material disposed around and upon the short and long channel devices as described above. The dielectric layer 910 forms a bottom dielectric isolation layer isolating the nanosheet stacks from the substrate and also forms gate spaces adjacent to the dummy gate 405, and portions of hard mask 410.

Figure 10:
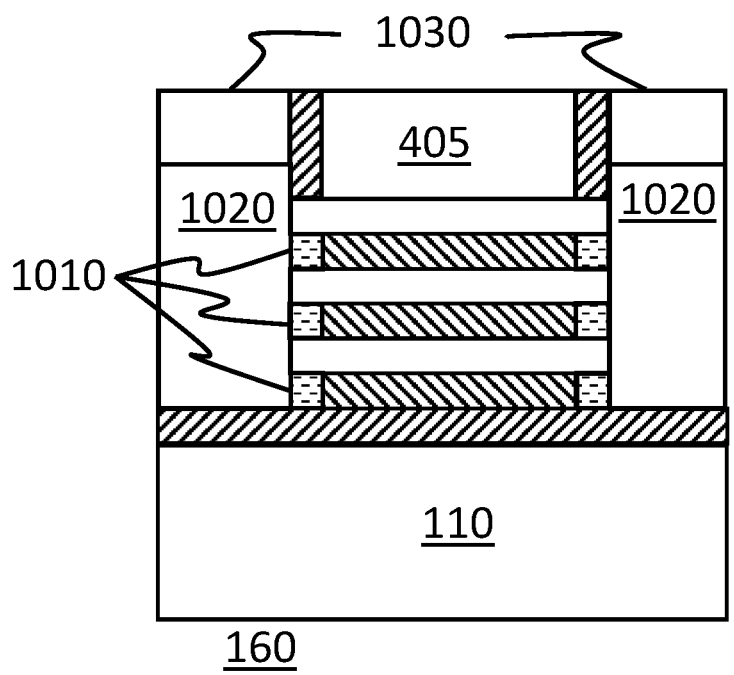
FIG. 10 provides a cross-sectional view along section line X2 of FIG. 1, of a step in the fabrication of semiconductor devices, according to an embodiment of the invention. The figure illustrates the addition source-drain regions, inter-layer dielectric, and inner spacers to the long channel device.

Reference is now made to FIG. 10, illustrating a step in the formation of the semiconductor devices of an embodiment of the invention. As shown in FIG. 10, inner spacers 1010 have been formed between adjacent pairs of nanosheet semiconductor channel layers 140. Prior to the formation of the inner spacers 1010, portions of the nanosheet stacks of sacrificial 130, and channel 140 layers are removed. The portions of the stacks of sacrificial semiconductor material layers 130, and semiconductor channel material layers 140, are removed by, for example, an etching process that removes horizontal exposed portions of the dielectric material 910, sacrificial semiconductor material layers 130, and semiconductor channel material layers 140, to form the stacks of layers. This etching can be performed using a timed anisotropic etch such as reactive ion etching (RIE). The etch can be performed in a single etch that removes material from dielectric layer 910, channel layers 140, and the sacrificial layers 130 or may, alternatively, be performed using etching processes that selectively affect the dielectric layer 910, channel layers 140, and the sacrificial layers 130, in turn.

In an embodiment, after removal of the nanosheet stacks in preparation for the inner spacers, portions of the sacrificial semiconductor layers 130 are etched away leaving gaps between the semiconductor channel layers 140. In an embodiment, a layer of nitride dielectric or similar material, is deposited on the short and long channel devices after the spacer etching is completed. This layer fills the gaps and coats the devices. The coating of the dielectric is then removed by an ashing process. Ashing can be performed using a plasma etch with a suitable reaction gas, for example, O2, N2, H2/N2, O3, CF4, or any combination thereof. The ashing process leaves the inter-channel layer 140 gaps, filled with the dielectric material inner spacers 1010.

As shown in FIG. 10, source and drain regions 1020 have been epitaxially grown adjacent to the sidewalls of layers 130 and 140 and the bottom dielectric isolation layer. After growth, the source-drain regions 1020 may be trimmed to an appropriate shape and size. Source-drain regions 1020 are grown after the formation of the inner spacers 1010.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 1020 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

In an embodiment, after the source-drain regions 1020 have been grown, isolation layer dielectric (ILD) 1030, are deposited adjacent to the source-drain regions 1020 and the gate spacer dielectric 910. ILD 1030 are deposited as described above.

Figure 11:
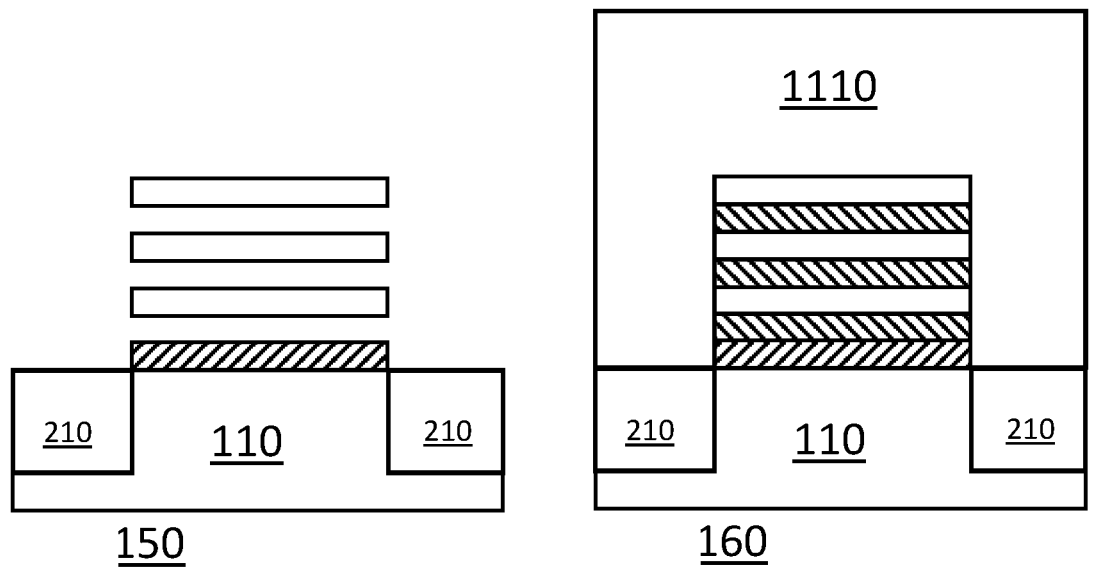
FIG. 11 provides a cross-sectional view along each of section lines Y1 and Y2 of FIG. 1, of a step in the fabrication of semiconductor devices, according to an embodiment of the invention. The figure illustrates the addition of a masking organic planarization layer to the long channel device and the removal of the sacrificial layers of the short channel device.
Figure 12:
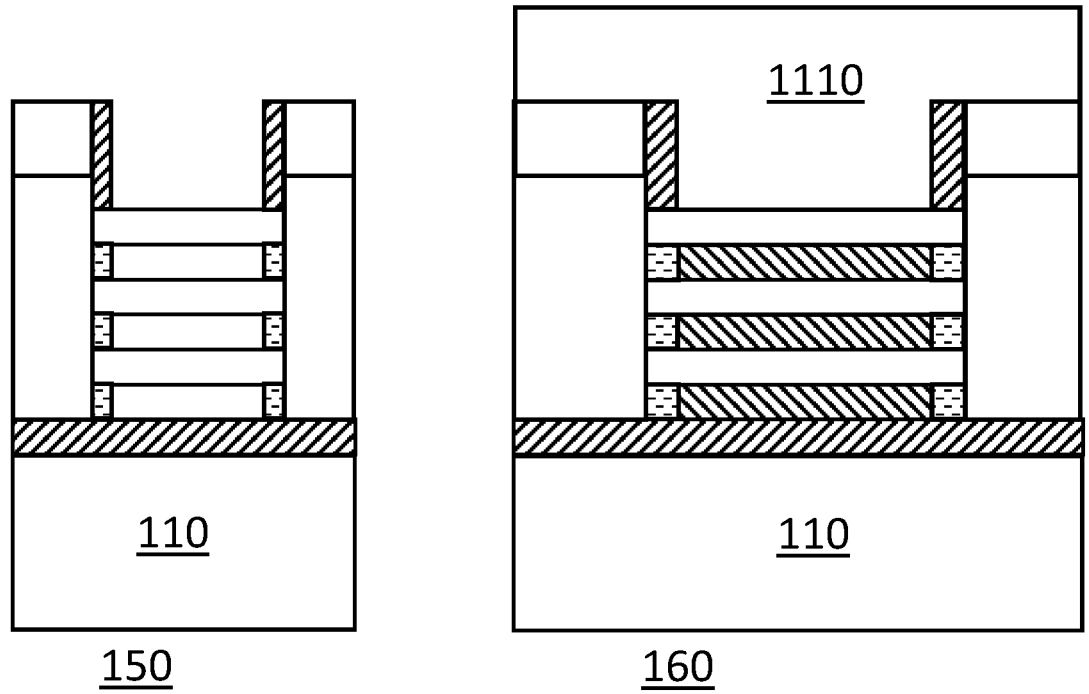
FIG. 12 provides a cross-sectional view along each of section lines X1 and X2 of FIG. 1, of a step in the fabrication of semiconductor devices, according to an embodiment of the invention. The figure illustrates the addition of a masking organic planarization layer to the long channel device and the removal of the sacrificial layers of the short channel device.

Reference is now made to FIGS. 11 and 12, illustrating a step in the formation of the semiconductor devices of an embodiment of the invention. FIG. 11 is a view of short channel device 150 along section line Y1 of FIG. 1, and also a view of long channel device 160 along section line Y2 of FIG. 1. FIG. 12 is a view of short channel device 150 along section line X1 of FIG. 1, and also a view of long channel device 160 along section line X2 of FIG. 1. Dummy gate 405 has been removed by etching as described above. A photoresist layer of organic planarization material (OPL) 1110 is deposited upon the long channel device 160 using a photolithographic process and masks long channel device 160. After the deposition of the OPL, the sacrificial semiconductor layers 130 of the short channel device 150, are etched away as illustrated in FIGS. 11 and 12.

In an embodiment, sacrificial semiconductor material layers 130 are etched away using an isotropic etch, such as a wet or dry chemical etch selective to the sacrificial semiconductor material. The removal of sacrificial semiconductor material layers 130 leave gaps between the bottom dielectric isolation layer 910 and the lowest semiconductor channel material layer 140, as well as gaps between adjacent semiconductor material layers 130.

Figure 13:
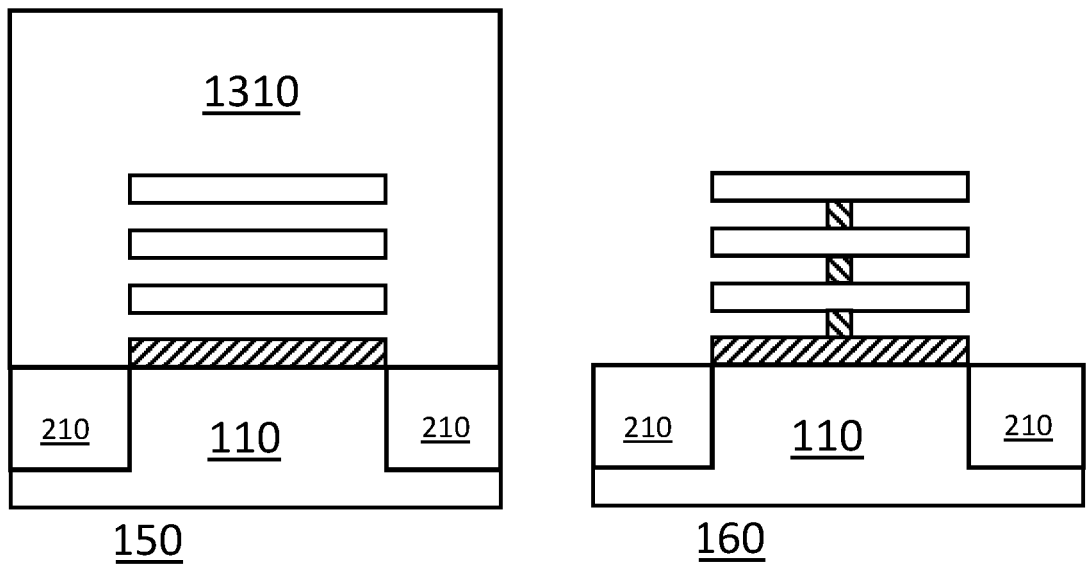
FIG. 13 provides a cross-sectional view along each of section lines Y1 and Y2 of FIG. 1, of a step in the fabrication of semiconductor devices, according to an embodiment of the invention. The figure illustrates the addition of a masking organic planarization layer to the short channel device and the removal of portions of the sacrificial layers of the long channel device.
Figure 14:
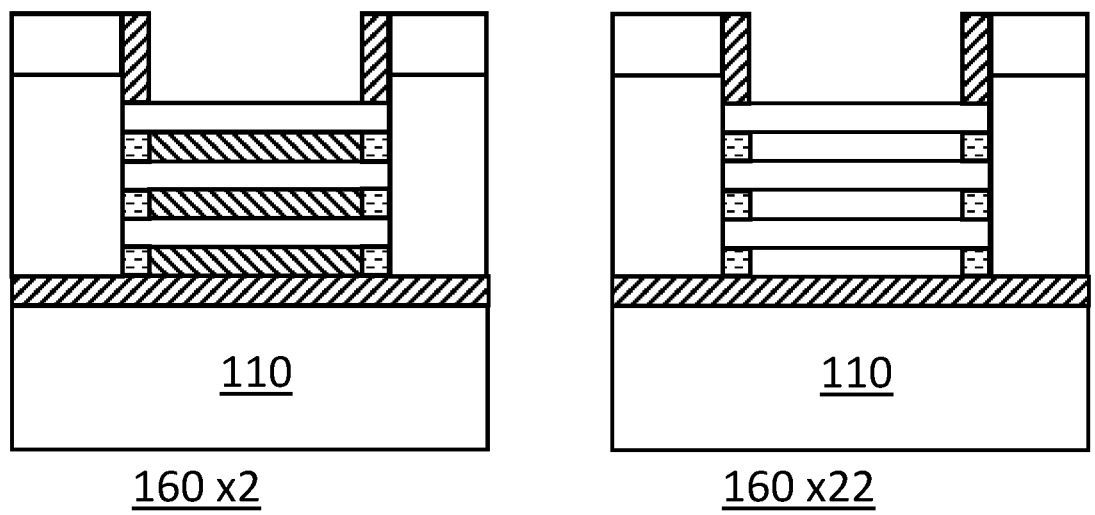
FIG. 14 provides a cross-sectional view along each of section lines X2 and X22 of FIG. 1, of a step in the fabrication of semiconductor devices, according to an embodiment of the invention. The figure illustrates the removal of portions the sacrificial layers of the long channel device.

Reference is now made to FIGS. 13 and 14, illustrating a step in the formation of the semiconductor devices of an embodiment of the invention. FIG. 13 is a view of short channel device 150 along section line Y1 of FIG. 1, and also a view of long channel device 160 along section line Y2 of FIG. 1. FIG. 14 is a view of long channel device 160 along section lines X2 and X22 of FIG. 1. As shown in the figures, OPL 1110 has been removed from long channel device 160. In an embodiment, the OPL 1110 is removed using an ashing process as described above. A short channel device OPL 1310, is then formed to mask the short channel device 150. As shown in the figures, after masking short channel device 150, portions of the sacrificial semiconductor material layers 130, of long channel device 160, are etched away. In an embodiment illustrated in FIGS. 13 and 14, the central portion of the sacrificial semiconductor layers 130 of the long channel device 160 are preserved between the channel layers 140 and between the bottom dielectric layer 910 and the lower most channel layer 140.

Figure 15:
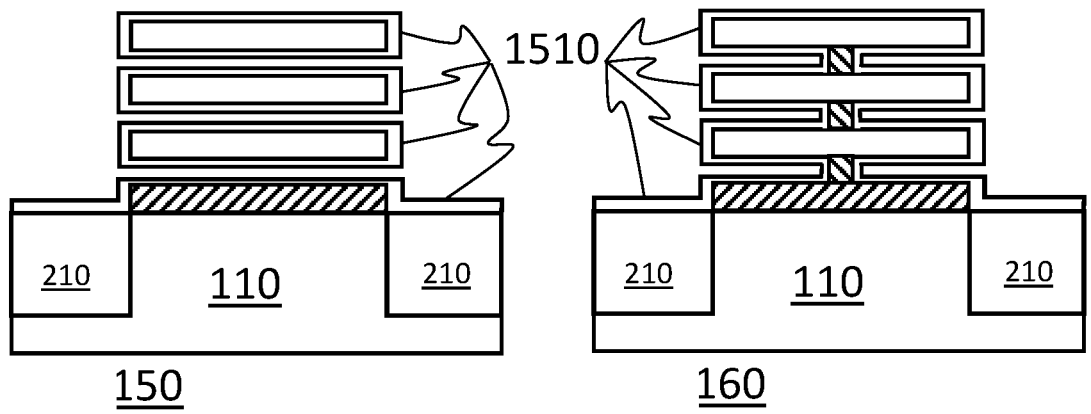
FIG. 15 provides a cross-sectional view along each of section lines Y1 and Y2 of FIG. 1, of a step in the fabrication of semiconductor devices, according to an embodiment of the invention. The figure illustrates the addition of a $GeO_2$ layer on and around the short channel and long channel devices.
Figure 16:
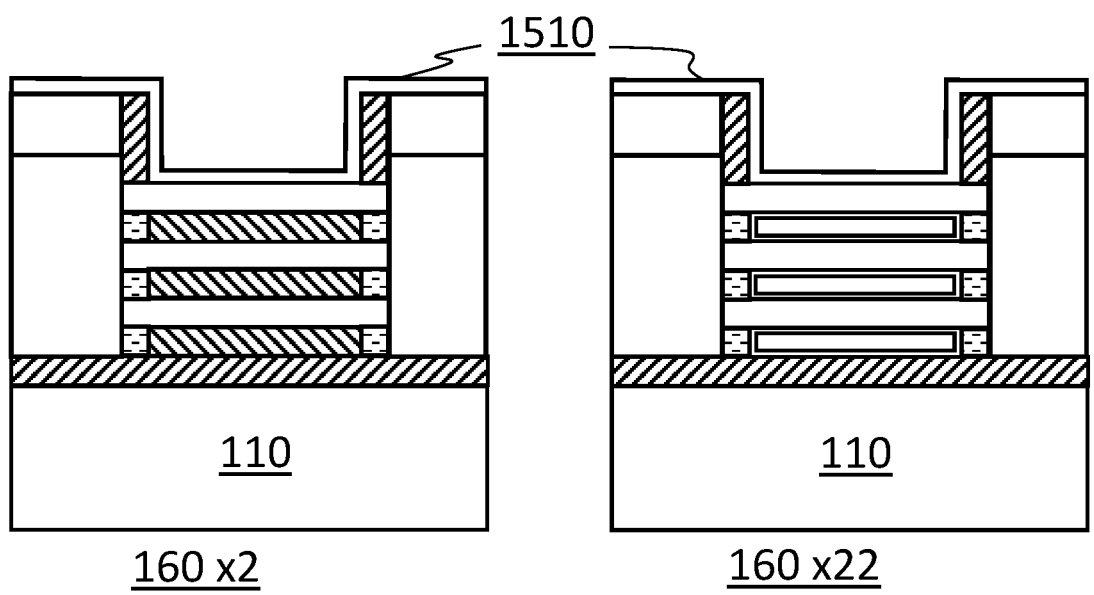
FIG. 16 provides a cross-sectional view along each of section lines X2 and X22 of FIG. 1, of a step in the fabrication of semiconductor devices, according to an embodiment of the invention. The figure illustrates the addition of a $GeO_2$ layer on and around the short channel and long channel devices.

Reference is now made to FIGS. 15 and 16, illustrating a step in the formation of the semiconductor devices of an embodiment of the invention. FIG. 15 is a view of short channel device 150 along section line Y1 of FIG. 1, and also a view of long channel device 160 along section line Y2 of FIG. 1. FIG. 16 is a view of long channel device 160 along each of section lines X2 and X22 of FIG. 1. Short channel device 150 OPL mask 1310 has been removed using an ashing process. A deposition process, as described above, applies a layer 1510 of $GeO_2$ or similar material on and around the surfaces of the short 150 and long 160 channel devices.

Figure 17:
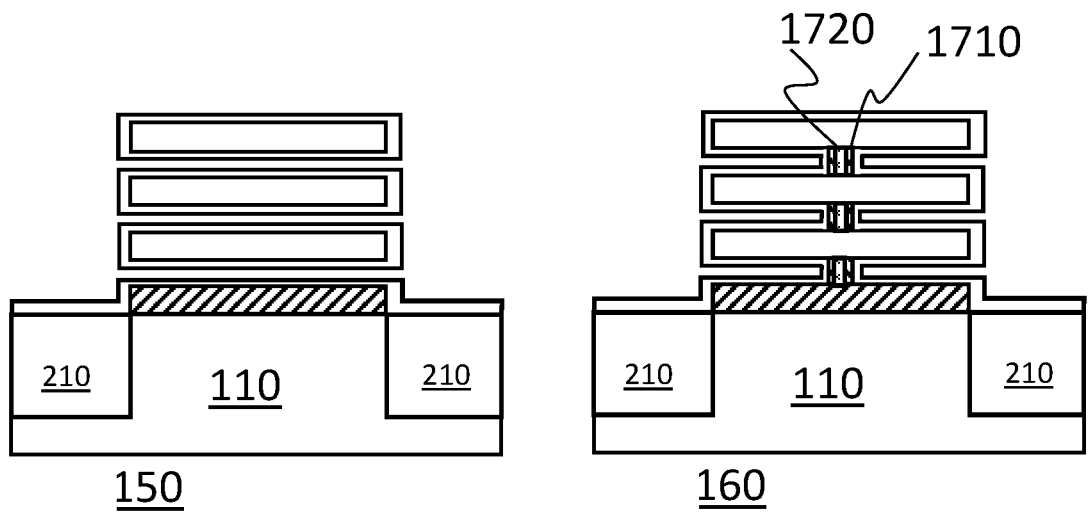
FIG. 17 provides a cross-sectional view along each of section lines Y1 and Y2 of FIG. 1, of a step in the fabrication of semiconductor devices, according to an embodiment of the invention. The figure illustrates the annealing of the central spacer pillars of the long channel device.
Figure 18:
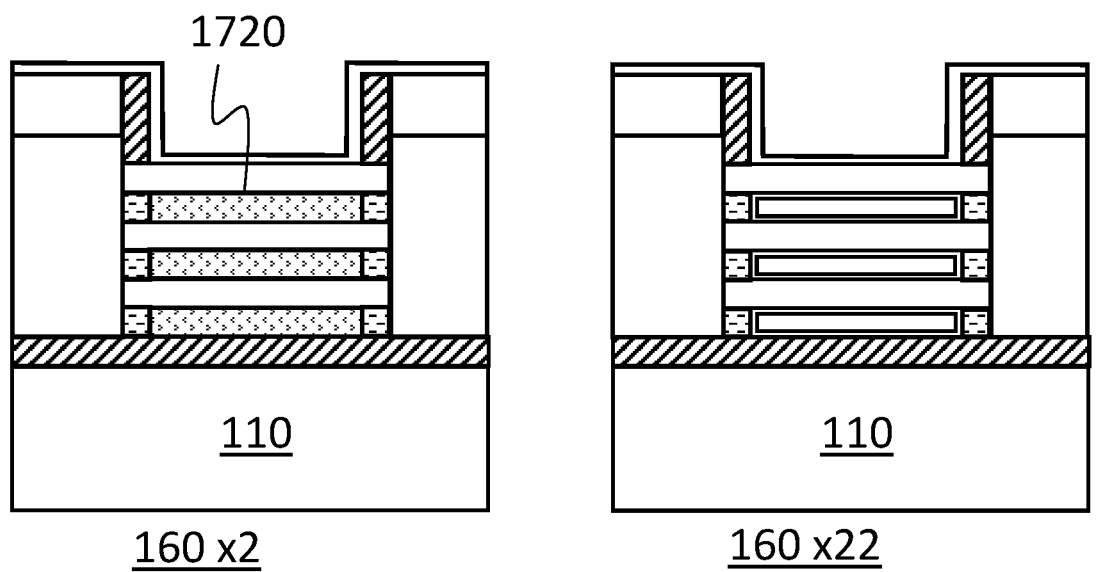
FIG. 18 provides a cross-sectional view along each of section lines X2 and X22 of FIG. 1, of a step in the fabrication of semiconductor devices, according to an embodiment of the invention. The figure illustrates the annealing of the central spacer pillars of the long channel device.

Reference is now made to FIGS. 17 and 18, illustrating a step in the formation of the semiconductor devices of an embodiment of the invention. FIG. 15 is a view of short channel device 150 along section line Y1 of FIG. 1, and also a view of long channel device 160 along section line Y2 of FIG. 1. FIG. 18 is a view of long channel device 160 along section lines X2 and X22 of FIG. 1. As shown in the figures, a two-stage process, first a low temperature (about 600 C) for 30 seconds in a Nitrogen atmosphere selectively oxidizes the outer portions of the sacrificial semiconductor material (SiGe) pillars into $SiO_2$, 1710 and leaves the core of the pillar of material with a higher Ge content. The second stage, 550 C for SS seconds in an Oxygen atmosphere, yields a pillar core of $SiGeO_x$ material 1720. After the two-stage process has completed, the remaining $GeO_2$ material 1510 is washed away.

Figure 19:
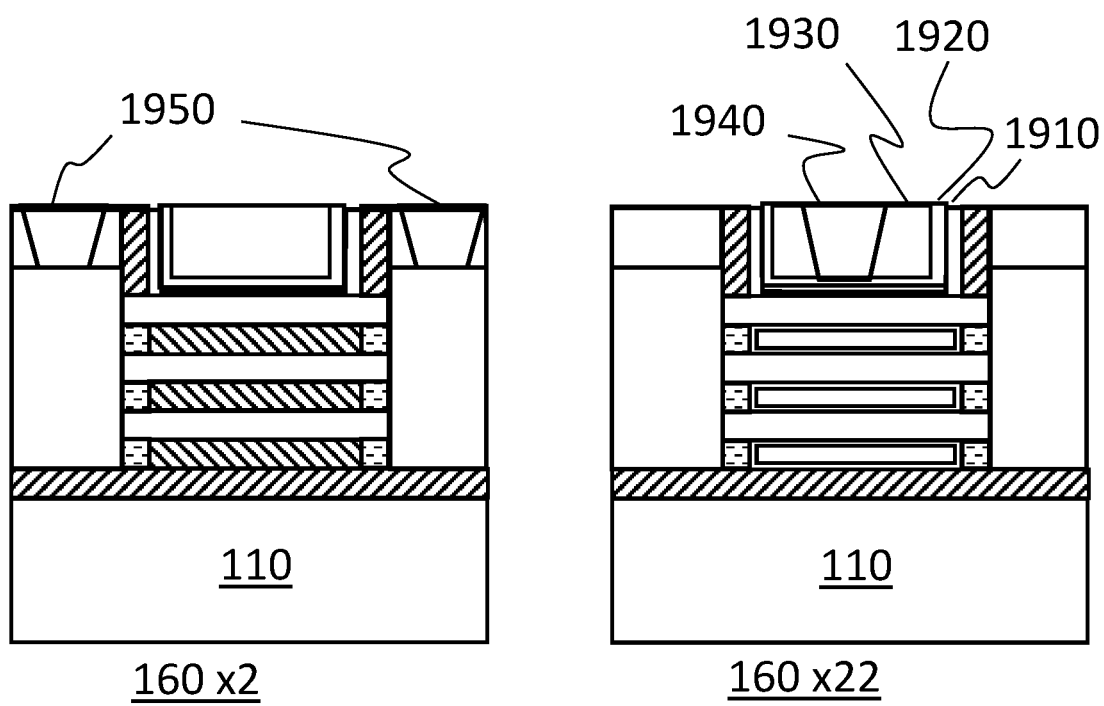
FIG. 19 provides a cross-sectional view along each of section lines X2 and X22 of FIG. 1, of a step in the fabrication of semiconductor devices, according to an embodiment of the invention. The figure illustrates the completion of the device gate stacks and the addition of source-drain and gate contacts.

Reference is now made to FIG. 19, illustrating a step in the formation of the semiconductor devices of an embodiment of the invention. FIG. 19 is a view of long channel device 160 along section lines X2 and X22 of FIG. 1. As shown in the figure, gate formation is complete with the addition of a high-k dielectric layer 1910 and work function metal layer 1920, to the semiconductor devices 150 and 160. In an embodiment, work function metal layer 1920 is disposed using ALD as described above.

As used herein, "high-k" denotes a dielectric material featuring a dielectric constant (k) higher than the dielectric constant of silicon dioxide. The high-k gate dielectric layer 510, can include at least one metallic element. Some examples of high-k dielectric materials suitable for the gate dielectric layer 510 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In an embodiment, the gate dielectric layer 510 is disposed using a deposition method as described above. In one embodiment, the gate dielectric layer 510 has a thickness that ranges from about 1 nm to about 3 nm. In another embodiment, the gate dielectric layer 510 has a thickness that ranges from about 1.5 nm to about 2 nm.

Work function layer 1920 may comprise metals, such as tungsten, nickel, titanium, molybdenum, tantalum, copper, platinum, silver, gold, ruthenium, iridium, rhenium, and rhodium and alloys thereof including titanium aluminum and titanium nitride alloys, and doped semiconductor materials such as, e.g., doped polysilicon. In an embodiment, work function metal layer 1920 comprises multiple layers of different metals.

As shown in the figure, a layer of passivating dielectric 1930 (or inter-layer dielectric) is deposited over the device structure. It is specifically contemplated that the passivating dielectric 1930 may be, e.g., silicon dioxide, but any other appropriate dielectric material may be used instead. Openings in the passivating dielectric 1930 are formed using, for example, any appropriate anisotropic etch. Gate contacts 1940 and source-drain contacts 1950 are then formed in the openings to provide electrical connectivity to the gate work function metal 1920 and to the source-drain regions 1020.

Figure 20:
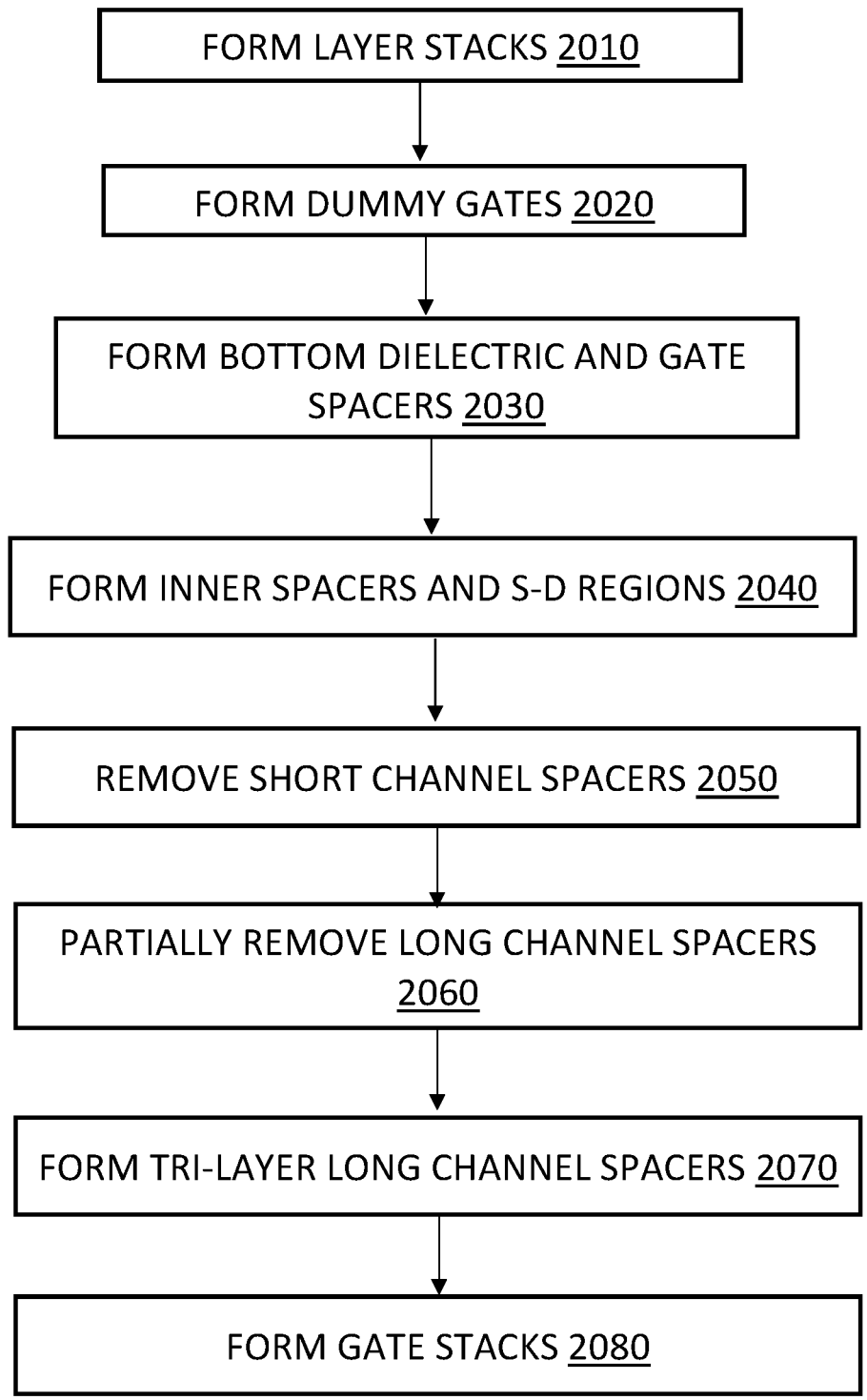
FIG. 20 provides a flowchart depicting the steps of a semiconductor device fabrication method, according to an embodiment of the invention.

Reference is now made to FIG. 20, a flowchart depicting steps of a method of concurrently forming long channel and short channel semiconductor devices on a single die, according to an embodiment of the invention. As shown in the figure, at 2010, the method deposits material and forms a stack of vertically aligned, alternating sacrificial and channel nanosheet layers formed on a base substrate. The stack begins with a first sacrificial layer having a first concentration of Germanium. This first layer is followed by alternating layers of sacrificial layers and channel material layers. These sacrificial layers are of uniform thickness and have a Germanium content which differs from that of the first sacrificial layer. Portions of the stacks are removed yielding vertically aligned stacks of nanosheets separated by shallow trench isolation dielectric regions. At 2020, in an embodiment, the method deposits a dummy gate and a hard mask, providing protection for portions of the vertically aligned stacks of layers. The dummy gate and hard mask are patterned to match the shape of the final gate areas of the semiconductor device design. At 2030, the method removes the bottom sacrificial layers of the short and long channel devices and deposits a bottom dielectric isolation layer between the base substrate and the next sacrificial layer. Dielectric material is also deposited along the sidewalls of the dummy gate during this process. In an embodiment, the sacrificial layer is removed by selective etching. At 2040, portions of the dielectric material, the remaining sacrificial layers, and the channel layers are etched away. After the initial removal, edge portions of the remaining sacrificial layers are removed and replaced with inner spacer dielectric material. The dielectric material is deposited as a coating on the devices. The majority of the coating is removed by an ashing process, leaving only the inner spacer dielectric portions between the channel layers. After formation of the inner spacers, source-drain regions are epitaxially grown adjacent to the nanosheet stacks, the inner spacers, and upon the bottom dielectric isolation layer. At block 2050, the long channel device is masked using an organic planarization material layer and the sacrificial spacer layers of the short channel device are etched away. At block 2060, the long channel device OPL layer is removed by ashing, the short channel device is masked with an OPL layer and portions of the long channel sacrificial spacer layers are etched away, leaving a central pillar of sacrificial semiconductor material between the adjacent channel layers. At 2070, the short channel OPL is washed away and a coating of $GeO_2$, or similar material, is deposited upon and around the device elements. The devices are subjected to a two-stage annealing process which converts the central pillars of sacrificial material to tri-layer spacers. In an embodiment, the spacers have outer layers of $SiO_2$, and an inner layer of $SiGeO_x$. The remaining $GeO_2$ coating is washed off the devices. At block 2080, the devices are completed with gate stacks including an interface high-k dielectric and a work function metal layer. A layer of passivating dielectric is added to the devices, contact regions are etched in the dielectric material and gate and source-drain contacts are disposed in the contact regions.

What is claimed is:

1. A semiconductor device comprising:
   a plurality of vertically aligned long channel semiconductor channel layers disposed above a substrate layer;
   a plurality of vertically aligned short channel semiconductor channel layers disposed above the substrate layer; and
   a plurality of tri-layer dielectric spacers disposed between the vertically aligned long channel semiconductor layers, wherein the tri-layer dielectric spacers are not disposed between the short channel semiconductor channel layers.

2. The semiconductor device according to claim 1 wherein the long channel semiconductor layers comprise a first width and the tri-layer dielectric spacers comprise a second width, the second width being less than the first width.

3. The semiconductor device according to claim 1 further comprising uniform layers of high-k dielectric material and work function metal on and around each of the plurality of vertically aligned semiconductor channel layers.

4. The semiconductor device according to claim 3, wherein the uniform layers of high-k dielectric material and the work function metal are disposed upon the tri-layer dielectric spacers.

5. The semiconductor device according to claim 1 further comprising a bottom dielectric isolation layer disposed between the substrate layer and the vertically aligned semiconductor channel layers.

6. The semiconductor device according to claim 5, further comprising a tri-layer dielectric spacer disposed between the bottom dielectric isolation layer and a long channel semiconductor channel layer.

7. The semiconductor device according to claim 1 wherein the semiconductor channel layers comprise silicon.

8. The semiconductor device according to claim 1 wherein the tri-layer dielectric spacers comprise two outer layers of a first dielectric material and an inner layer of a second dielectric material.

9. The semiconductor device according to claim 8 wherein the first dielectric material comprises $SiO_2$, and wherein the second dielectric material comprises $SiGeO_x$.

10. A semiconductor device comprising:
    a plurality of vertically aligned long channel semiconductor channel layers disposed above a substrate layer;
    a plurality of vertically aligned short channel semiconductor channel layers disposed above the substrate layer;
    a plurality of tri-layer dielectric spacers disposed between the vertically aligned long channel semiconductor layers, wherein the tri-layer dielectric spacers are not disposed between the short channel semiconductor channel layers;
    a gate stack formed on, and around the vertically aligned semiconductor channel layers;
    source and drain elements disposed in contact with sidewalls of the vertically aligned semiconductor channel layers; and
    wherein the long channel semiconductor layers comprise a first width and the tri-layer dielectric spacers comprise a second width, the second width being less than the first width.

* * * * *